US006420231B1

(12) United States Patent
Harari et al.

(10) Patent No.: US 6,420,231 B1
(45) Date of Patent: Jul. 16, 2002

(54) PROCESSING TECHNIQUES FOR MAKING A DUAL FLOATING GATE EEPROM CELL ARRAY

(75) Inventors: Eliyahou Harari, Los Gatos; Jack H. Yuan, Cupertino; George Samachisa, San Jose, all of CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 09/613,640

(22) Filed: Jul. 11, 2000

Related U.S. Application Data

(63) Continuation of application No. 09/343,493, filed on Jun. 30, 1999, now Pat. No. 6,103,573.

(51) Int. Cl.$^7$ .............................................. H01L 21/336
(52) U.S. Cl. ...................... 438/257; 438/259; 438/261; 438/262; 438/263; 438/264; 438/265
(58) Field of Search ................................. 438/257, 267; 257/324, 314

(56) References Cited

U.S. PATENT DOCUMENTS

| | | | |
|---|---|---|---|
| 4,336,603 A | 6/1982 | Kotecha et al. | 365/182 |
| 4,380,057 A | 4/1983 | Kotecha et al. | 365/185 |
| 4,417,264 A | 11/1983 | Angle | 357/23 |
| 4,855,955 A | 8/1989 | Cioaca | 365/185 |
| 5,021,999 A | 6/1991 | Kohda et al. | 365/188 |
| 5,043,940 A | 8/1991 | Harari | 365/168 |
| 5,070,032 A | 12/1991 | Yuan et al. | 438/267 |
| 5,095,344 A | 3/1992 | Harari | 357/23.5 |
| 5,095,461 A | 3/1992 | Miyakawa et al. | 365/185.14 |
| 5,159,570 A | 10/1992 | Mitchell et al. | 365/185 |

(List continued on next page.)

FOREIGN PATENT DOCUMENTS

| | | |
|---|---|---|
| EP | 0051158 | 10/1981 |
| JP | 55043862 | 3/1980 |
| JP | 55 043862 | 3/1980 |
| JP | 58 222561 | 12/1983 |
| JP | 58222561 | 12/1983 |
| JP | 7226449 | 8/1995 |
| WO | WO 95/19047 | 7/1995 |
| WO | WO95/19047 | 7/1995 |

OTHER PUBLICATIONS

Alberts et al., "Multi–Bit Storage FET EAROM Cell", IBM Technical Disclosure Bulletin, vol. 24, No. 7A, Dec. 1981, pp. 3311–3314.

(List continued on next page.)

Primary Examiner—Charles Bowers
Assistant Examiner—Hsien-Ming Lee
(74) Attorney, Agent, or Firm—Skjerven Morrill LLP

(57) ABSTRACT

An EEPROM system having an array of memory cells that individually include two floating gates, bit line source and drain diffusions extending along columns, steering gates also extending along columns and select gates forming word lines along rows of floating gates. The dual gate cell increases the density of data that can be stored. Rather than providing a separate steering gate for each column of floating gates, an individual steering gate is shared by two adjacent columns of floating gates that have a diffusion between them. Processing methods of forming such a cell array include two etching steps to separate strips of conductive material into individual floating gates that are self-aligned with source/drain diffusions and other gate elements. In one embodiment, this is accomplished by two etching steps with separate masks. In another embodiment, a reference dielectric mask is first formed over the conductive material layer strips and used as a reference for two etching masks that are aligned with each other. In a further embodiment, isolation of the memory cells is provided in the column direction by forming rectangular trenches in the substrate between cells that are filled with dielectric. Specific processing techniques also have applications to form single floating gate EEPROM cell arrays, other types of memory cells and integrated circuit elements.

14 Claims, 9 Drawing Sheets

U.S. PATENT DOCUMENTS

| | | | |
|---|---|---|---|
| 5,172,338 A | 12/1992 | Mehrotra et al. | 365/185 |
| 5,210,047 A | 5/1993 | Woo et al. | 438/257 |
| 5,278,439 A | 1/1994 | Ma et al. | 257/319 |
| 5,297,148 A | 3/1994 | Harari et al. | 371/10.2 |
| 5,313,421 A | 5/1994 | Guterman et al. | 365/185 |
| 5,315,541 A | 5/1994 | Harari et al. | 365/63 |
| 5,343,063 A | 8/1994 | Yuan et al. | 257/317 |
| 5,364,806 A | 11/1994 | Ma et al. | 438/266 |
| 5,412,600 A | 5/1995 | Nakajima | 365/185 |
| 5,414,693 A | 5/1995 | Ma et al. | 365/185 |
| 5,636,160 A | 6/1997 | Omino et al. | 365/185.02 |
| 5,661,053 A | 8/1997 | Yuan | 438/257 |
| 5,712,180 A | 1/1998 | Guterman et al. | 438/263 |
| 5,714,412 A | 2/1998 | Liang et al. | 438/266 |
| 5,812,449 A | 9/1998 | Song | 365/185.03 |
| 5,991,201 A | 11/1999 | Kuo et al. | 365/185.19 |
| 6,103,573 A * | 8/2000 | Harari et al. | 438/257 |
| 6,151,248 A | 11/2000 | Harari et al. | 365/185.14 |
| 6,166,410 A * | 12/2000 | Lin et al. | 257/324 |

OTHER PUBLICATIONS

Kamiya et al., "EPROM Cell with igh Gate Injection Efficiency", Int'l Electron Device Mtg., Technical Digest, Dec. 13, 1982, pp. 741–744.

Ma et al., "A Dual–bit Split–Gate EEPROM (DSG) Cell in Contactless Array for Single–Vcc High Density Flash Memories", 1994 IEEE pp. 3.5.1 thru 3.5.4.

Alberts et al., "Multi–Bit Storage FET EAROM Cell", IBM Technical Disclosure Bulletin, vol. 24, No. 7A, Dec. 1981, pp. 3311–3314.

Kamiya et al., "EPROM Cell with igh Gate Injection Efficiency", Int'l Electron Device Mtg., Technical Digest, Dec. 13, 1982, pp. 741–744.

Ma et al., "A Dual–bit Split–Gate EEPROM (DSG) Cell in Contactless Array for Single–Vcc High Density Flash Memories", 1994 IEEE pp. 3.5.1 thru 3.5.4.

* cited by examiner

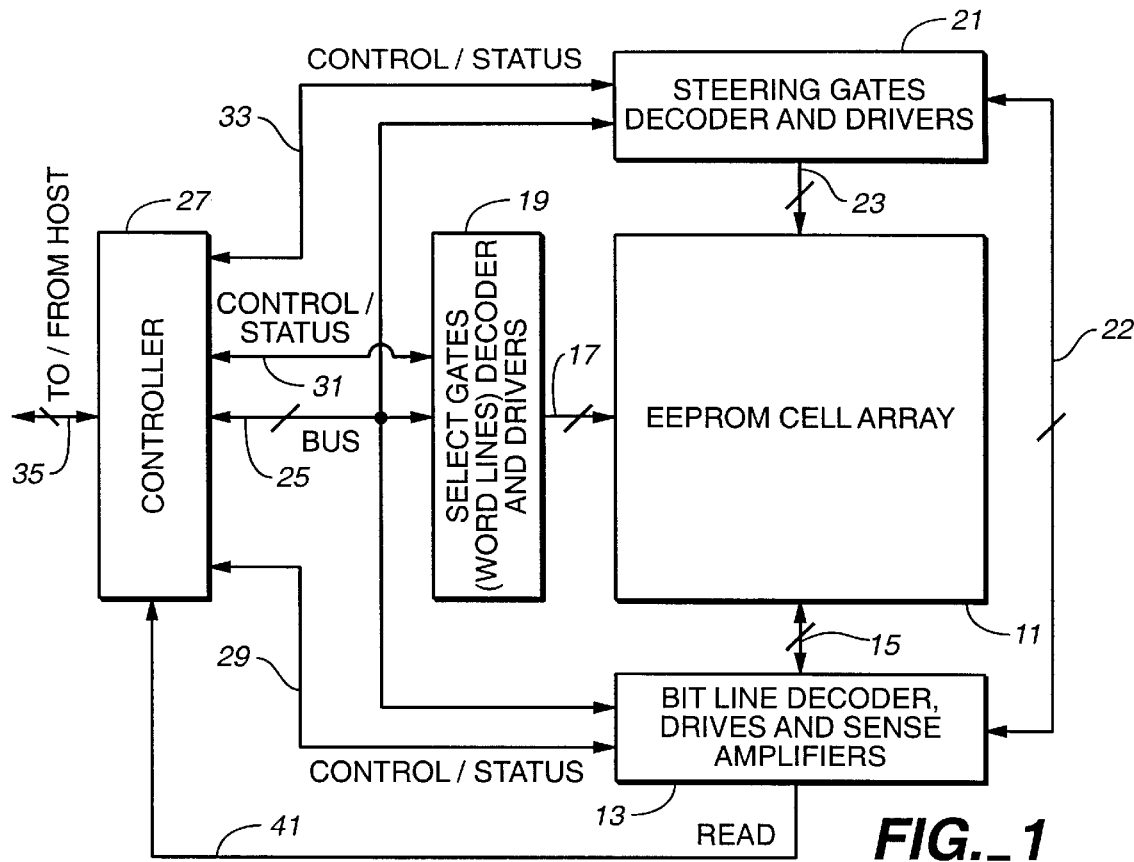
FIG._1
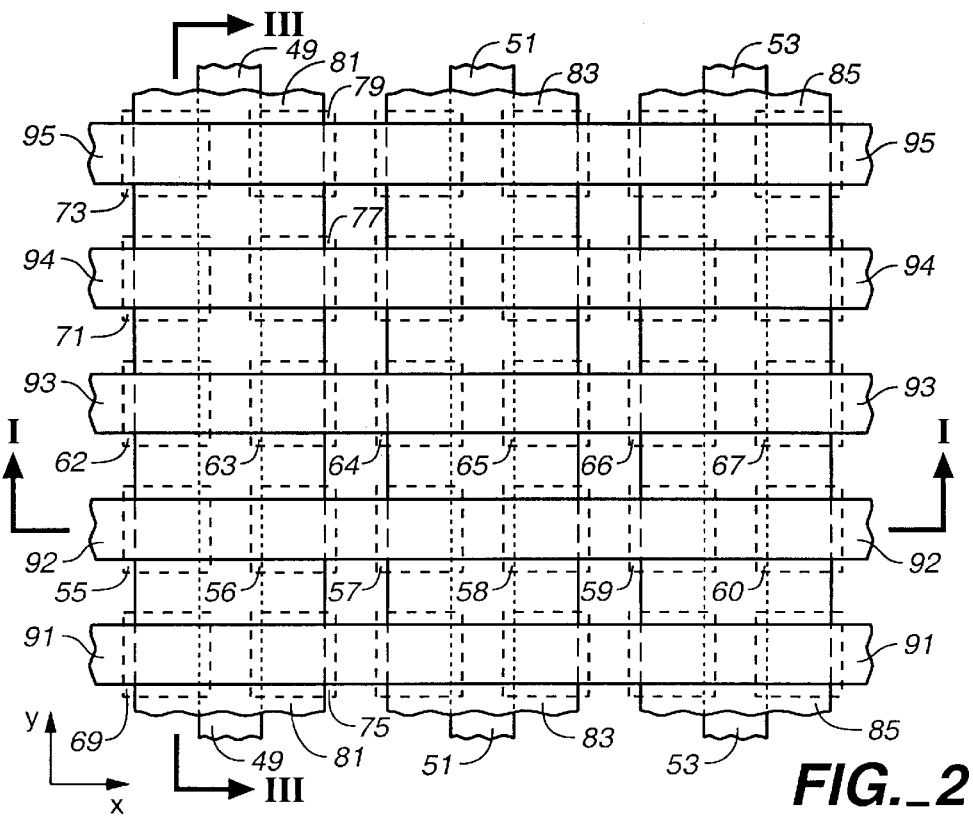
FIG._2

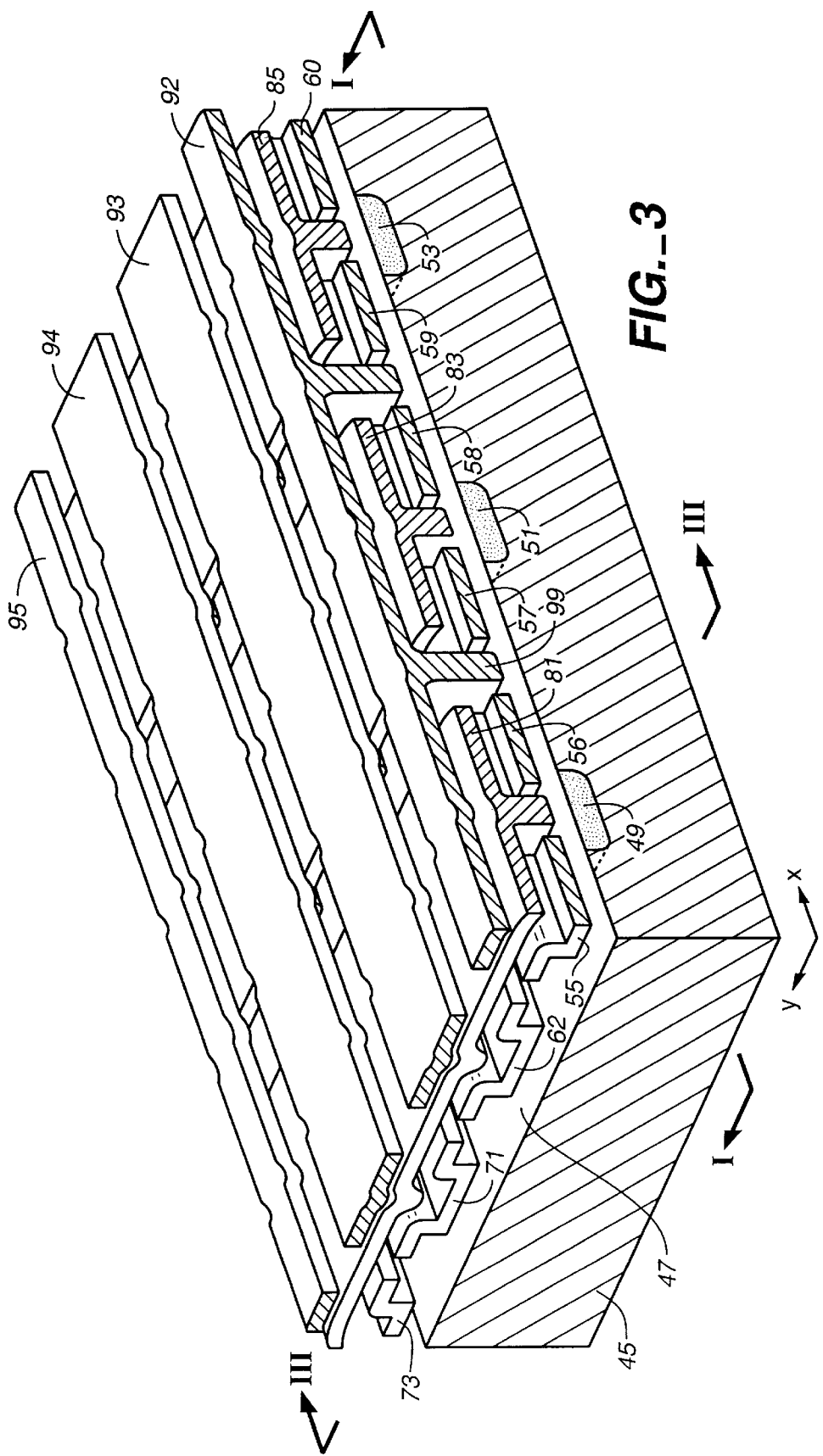
FIG._3

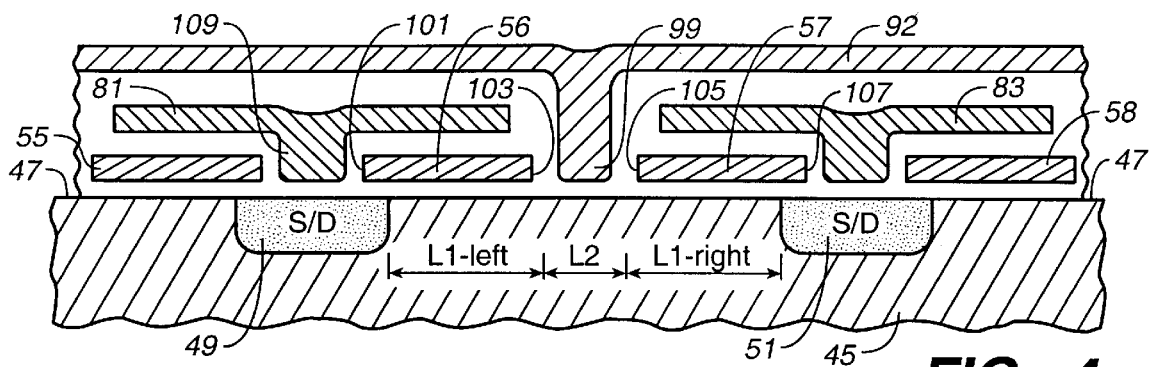
*FIG._4*
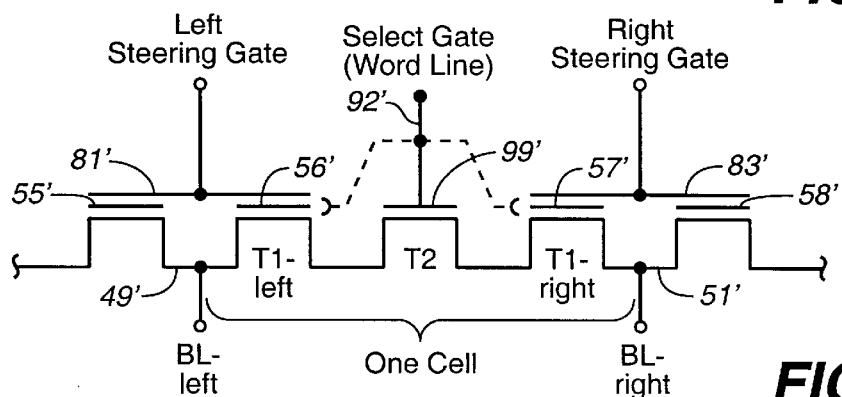
*FIG._5*
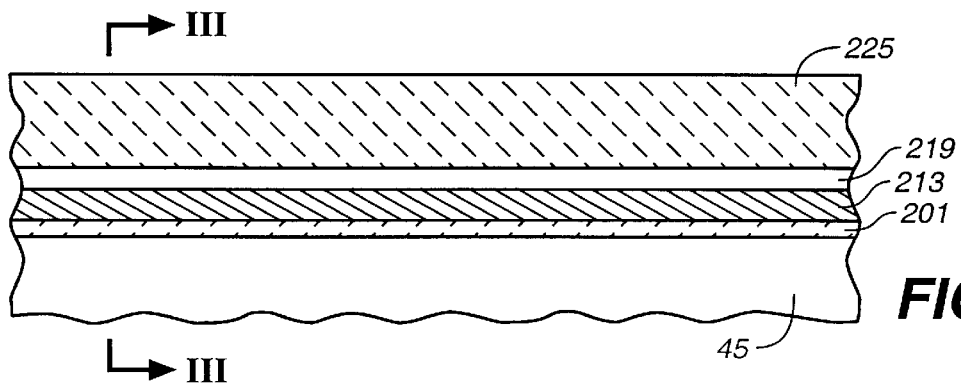
*FIG._6A*
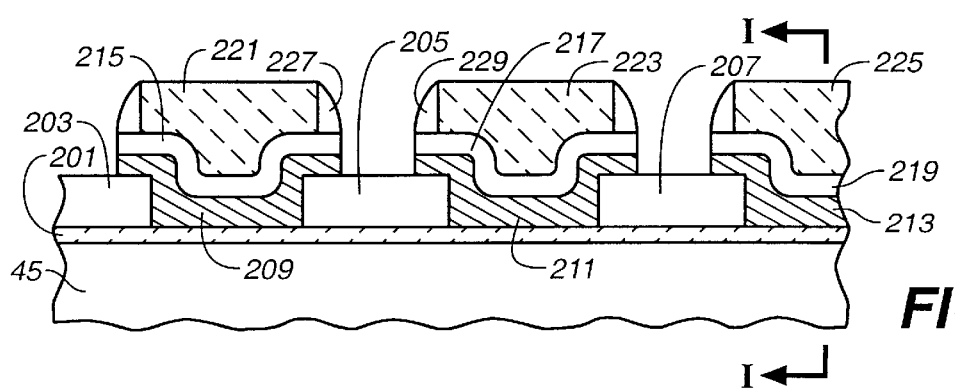
*FIG._6B*

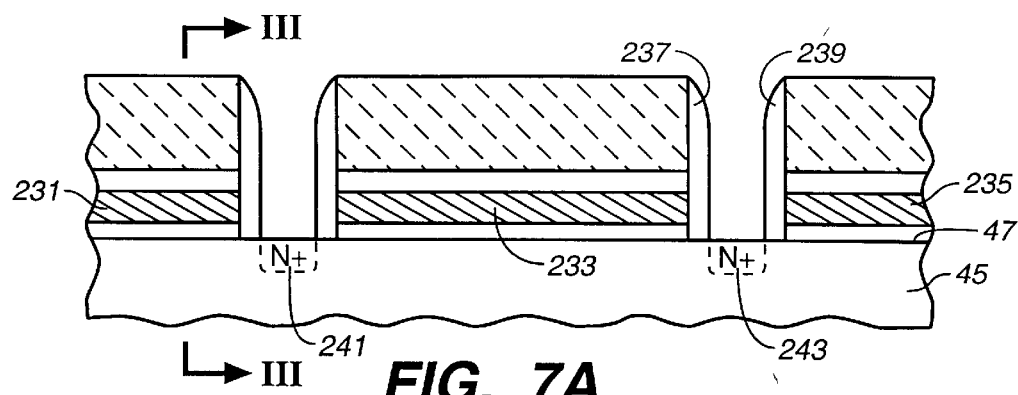
FIG._7A
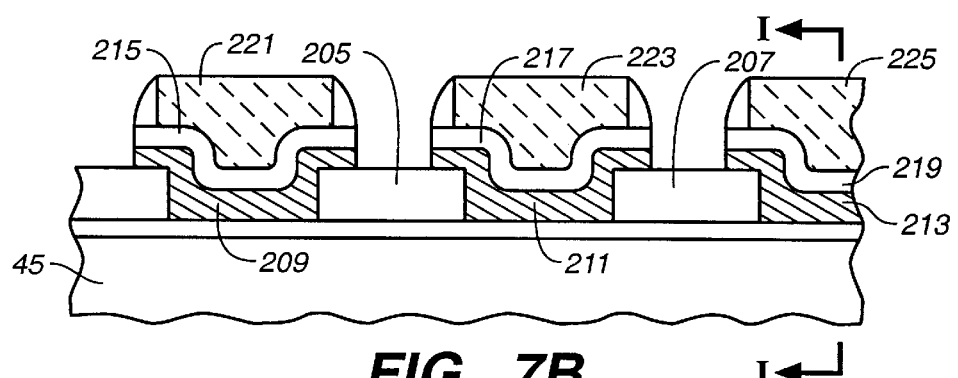
FIG._7B
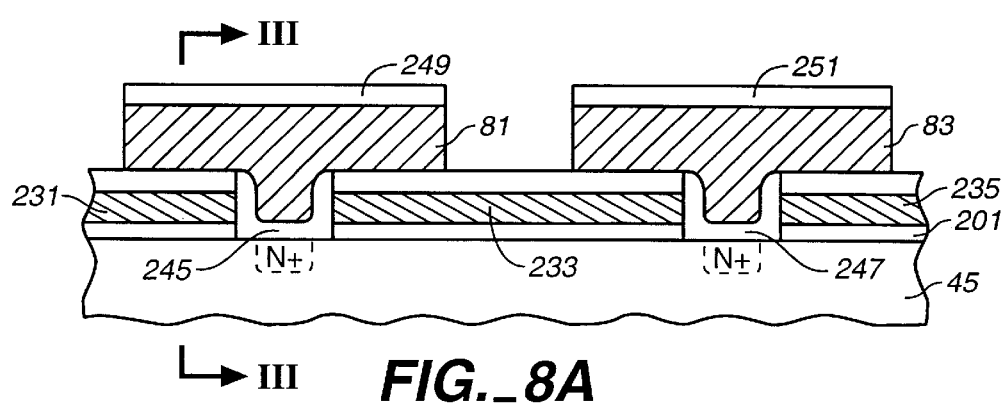
FIG._8A
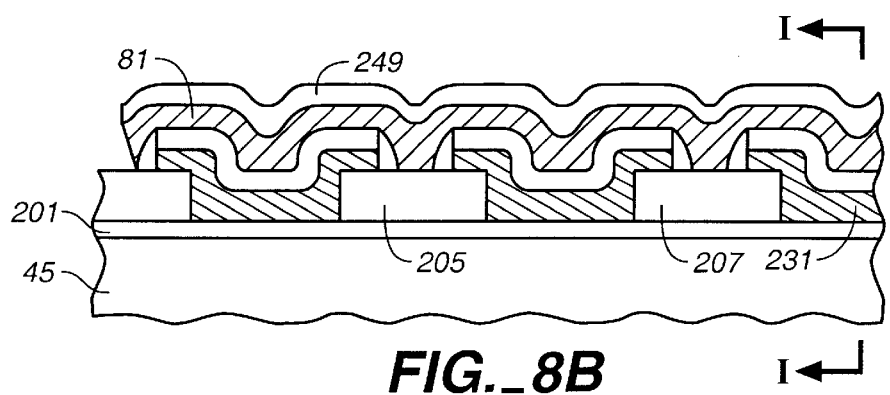
FIG._8B

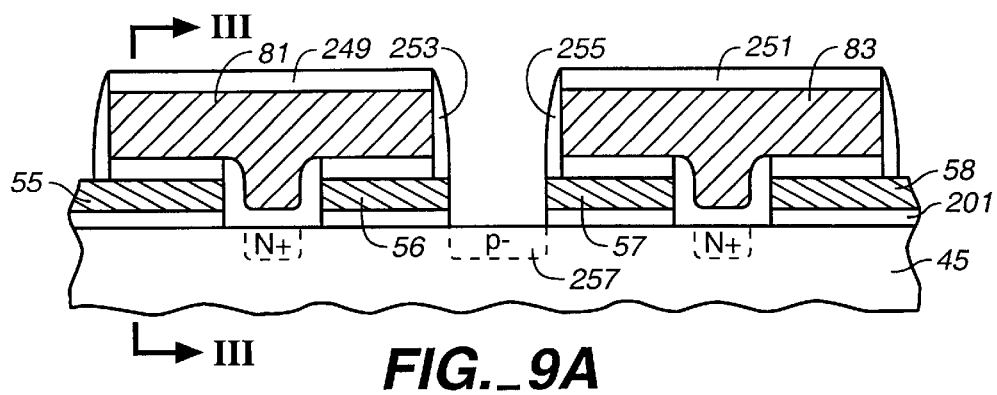
FIG._9A
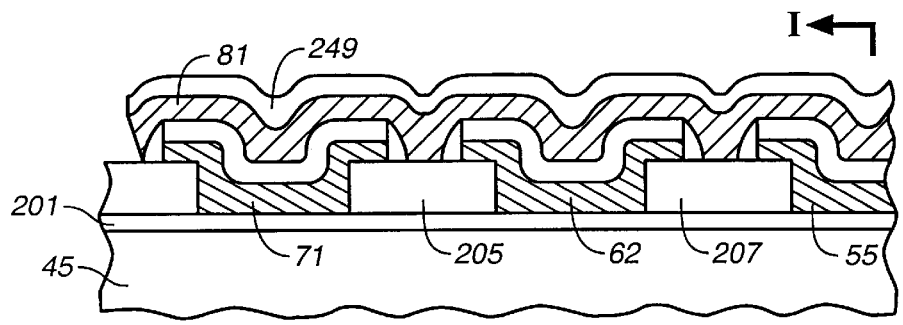
FIG._9B
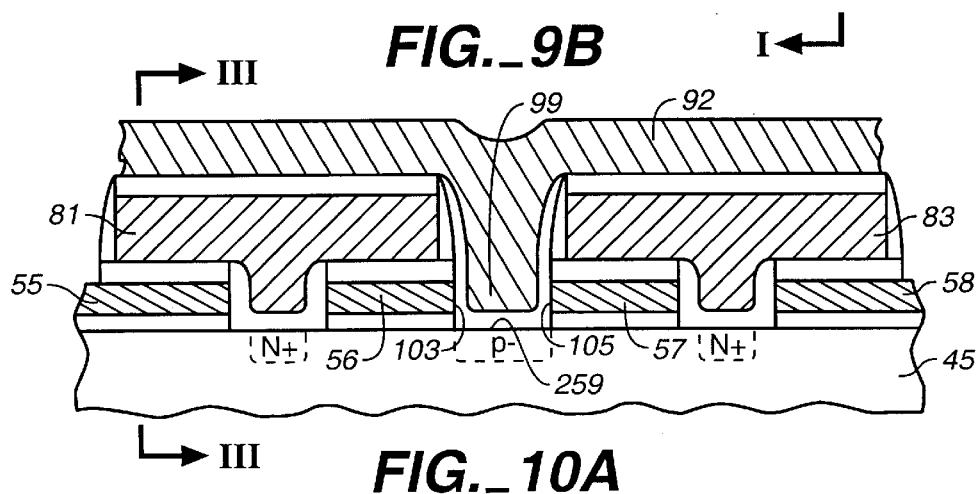
FIG._10A
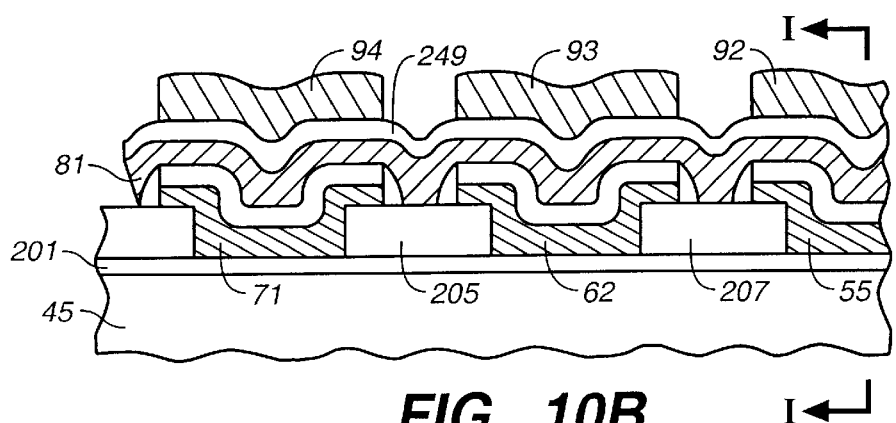
FIG._10B

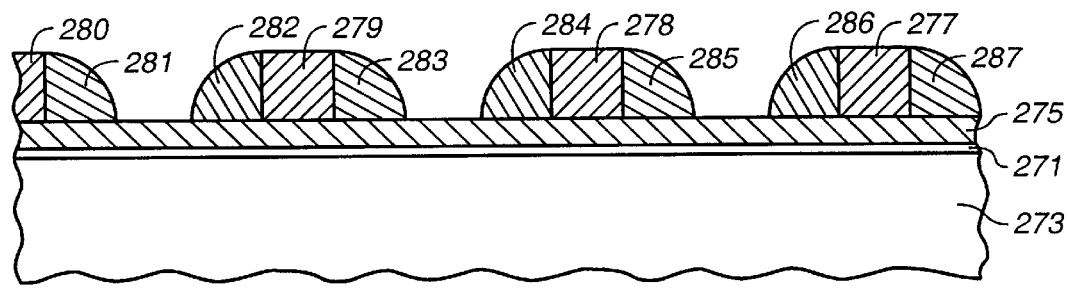
FIG._11
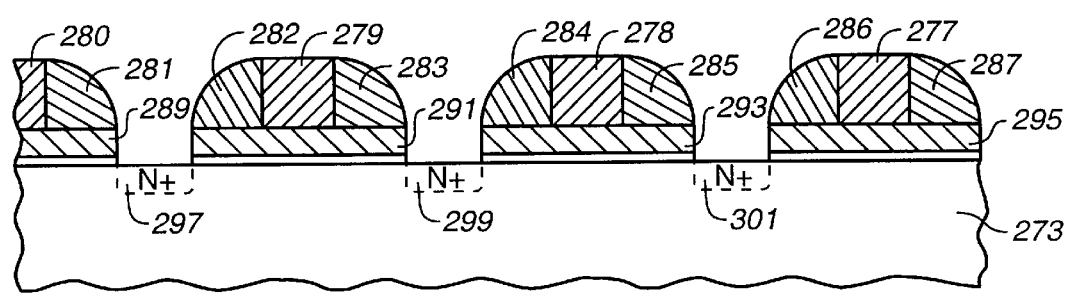
FIG._12
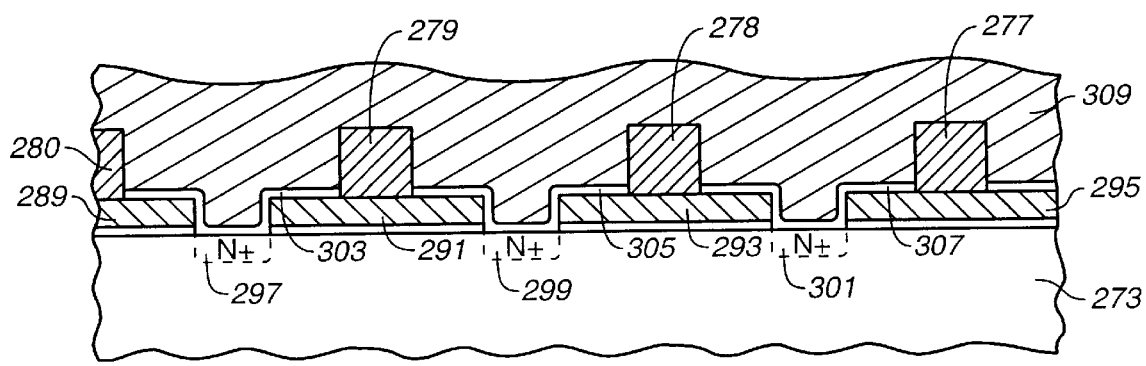
FIG._13

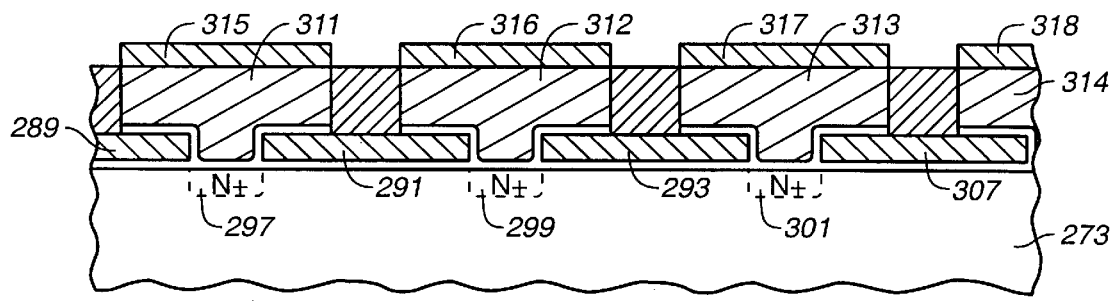
FIG._14
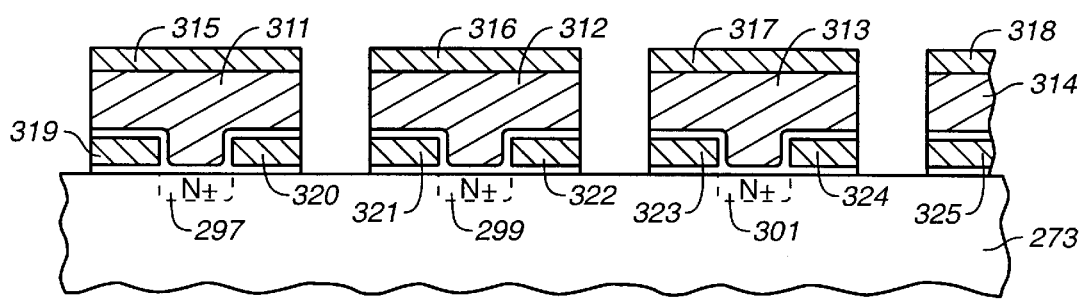
FIG._15
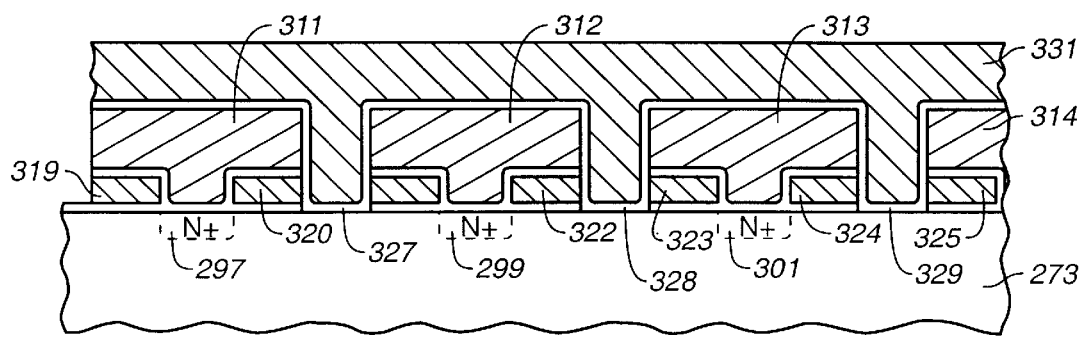
FIG._16

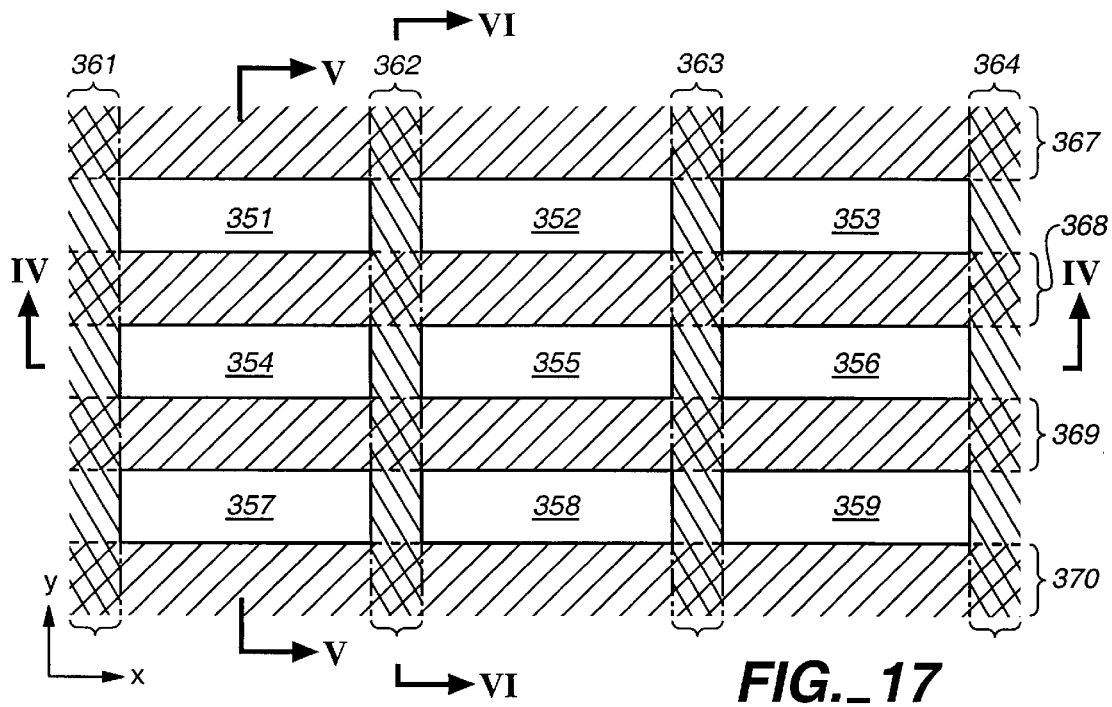
FIG._17
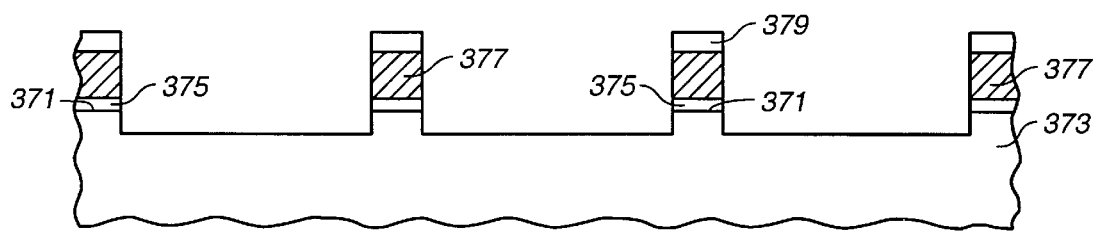
FIG._18
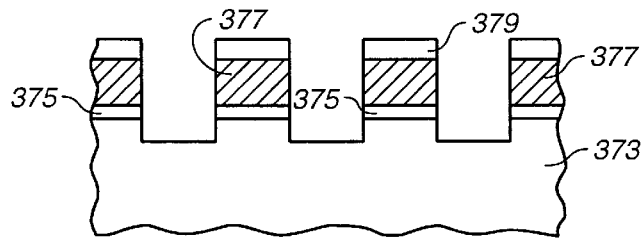
FIG._19
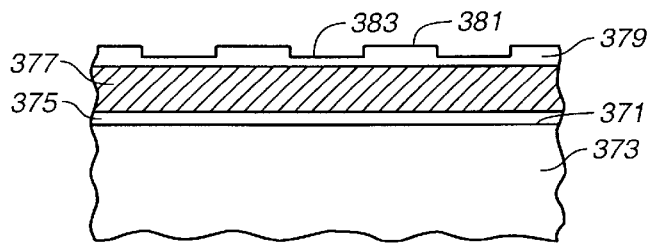
FIG._20

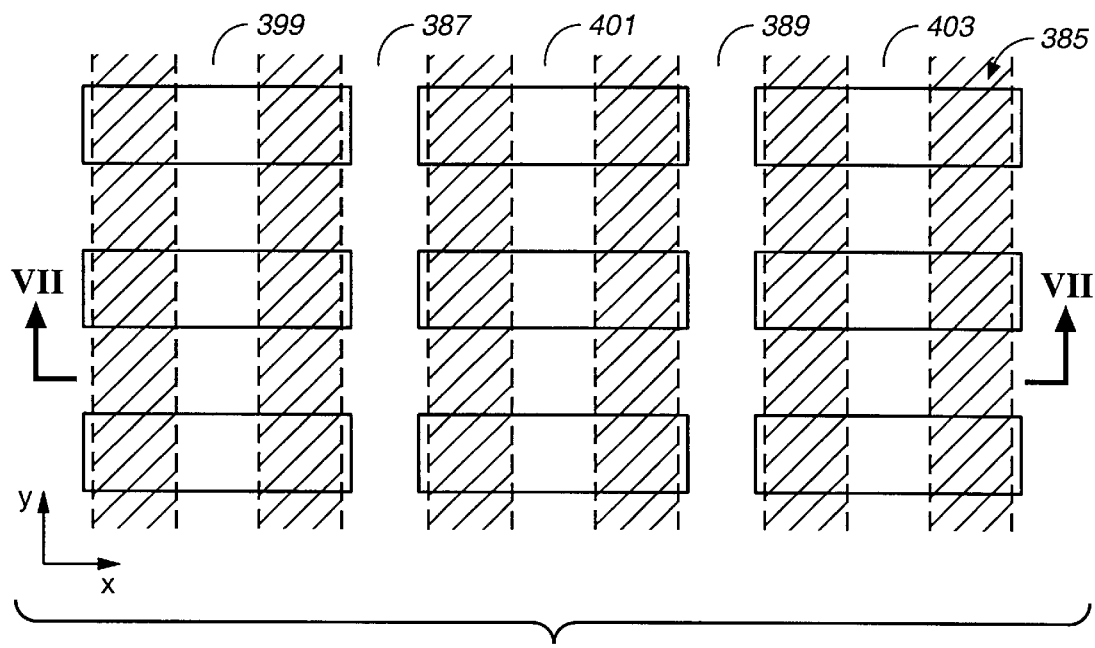
FIG._21
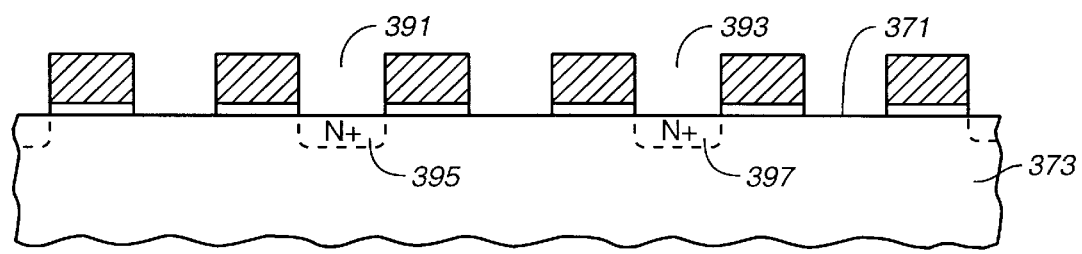
FIG._22

PROCESSING TECHNIQUES FOR MAKING A DUAL FLOATING GATE EEPROM CELL ARRAY

CROSS-REFERENCE TO RELATED APPLICATION

This is a continuation of patent application Ser. No. 09/343,493, filed on Jun. 30, 1999, now U.S. Pat. No. 6,103,573; which in turn is related to another application Ser. No. 09/343,328, filed, Jun. 30, 1999, by Eliyahou Harari, Daniel C. Guterman, George Samachisa and Jack H. Yuan, entitled: "Dual Floating Gate EEPROM Cell Array with Steering Gates Shared by Adjacent Cells," now U.S. Pat. No. 6,151,248, which is incorporated herein in its entirety by this reference.

BACKGROUND OF THE INVENTION

This invention relates generally to flash EEPROM (Electrically Erasable and Programmable Read Only Memory) systems, and, more specifically, to processing techniques for forming memory arrays of flash EEPROM cells including, but not limited to, flash EEPROM cells that individually contain two floating gates.

There are many commercially successful non-volatile memory products being used today, particularly in the form of small cards, which use a flash EEPROM array of cells having a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in copending U.S. patent application Ser. No. 09/239,073, filed Jan. 27, 1999, which patents and application are incorporated herein by this reference.

A modification of this split-channel flash EEPROM cell adds a steering gate positioned between the floating gate and the word line. Each steering gate of an array extends over one column of floating gates, perpendicular to the word line. The effect is relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described in U.S. Pat. No. 5,313,421, which patent is incorporated herein by this reference.

In either of the two types of memory cell arrays described above, the floating gate of a cell is programmed by injecting electrons from the substrate to the floating gate. This is accomplished by having the proper doping in the channel region and applying the proper voltages to the source, drain and remaining gate(s). So called "source side" injection is preferred, being described in the foregoing U.S. Pat. No. 5,313,421.

Two techniques of removing charge from floating gates to erase memory cells are used in each of the two types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the compromise of one or both functions that becomes necessary when they are executed at the same time. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sector's worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner since there is often at least one feature having a limit as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Therefore, in order to further increase data storage density, a flash EEPROM system using a dual floating gate memory cell is being utilized along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. This cell array architecture and operating techniques are described in U.S. Pat. No. 5,712,180 and copending application Ser. No. 08/910,947, filed Aug. 7, 1997, which patent and application are incorporated herein by this reference.

Therefore, it is among primary objects of the present invention to provide a dual floating gate memory cell array that permits increased density data storage and the downward scaling of its size.

It is another primary object of the present invention to provide improved techniques of processing flash EEPROM cell arrays, including those of the dual floating gate type.

SUMMARY OF THE INVENTION

These and additional objects are accomplished by the present invention, wherein, briefly and generally, an array of dual floating gate flash EEPROM cells is manufactured to have steering gates with widths that extend over and are capacitively coupled with two adjacent floating gates of adjacent memory cells in a row. This reduces the number of steering gates by one-half and, in an embodiment where the floating gates are formed on the surface of the substrate, increases their individual widths by more than twice since they also extend over a source or drain diffusion that is positioned between the adjacent cells. The wider steering gate allows it to be formed more easily, need not be the minimum resolvable feature size, provides an increased level of conduction along its length, and thus, when made of polysilicon material, reducing the number of contacts that must be made to it from metal conductors, and the making of those contacts becomes easier.

According to one specific processing aspect of the present invention, the source and drain diffusions and gate elements are self-aligned with one another by etching the first polysilicon (or other conductive) layer at two different times in one direction in order to form the floating gates. A first etching step separates first polysilicon layer strips into segments that are used to define the source and drain diffusions that are then formed in tile substrate between them. Steering gates are then formed with widths that bridge two adjacent segments over intermediate diffusions. The steering gates are then used as a mask for the second etching step to separate each of the first polysilicon segments into two floating gates by removing portions of the strips intermediate of the diffusions. The select transistor gates are then formed between the floating gates in the spaces formed by the second etch.

According to another specific processing aspect of the present invention, reference mask elements are temporarily formed along the length of first polysilicon layer strips to serve as a reference for defining the relative positions of the masks used for the two etching steps. The temporary mask elements have a dimension and are positioned to define the second etch. Spacers are initially formed adjacent the mask elements to provide openings between the spacers for the first etch of the first polysilicon strips and subsequent implantation of the source and drain regions therethrough. The spacers are then removed and a second layer of polysilicon is deposited over the exposed portions of the first polysilicon layer, implant regions and the reference mask elements. A portion of the second layer of polysilicon is then removed by chemical mechanical polishing ("CMP") to separate the second layer into steering gate strips having widths extending between the mask reference elements. The mask reference elements and the portions of the first polysilicon beneath them are then removed. Strips from a third layer of polysilicon or polycide are then formed over the steering gates to serve as word lines and into the newly etched spaces as select transistor gates.

According to a further specific processing aspect of the present invention, a modified structure provides isolation between rows of memory cells by forming trenches in the substrate between adjoining memory cells in columns. The trenches and spaces between floating gates are then filled with field oxide, rather than providing strips of field oxide above the substrate between rows of cells as in the other embodiments. Rectangular trenches are positioned between adjacent source and drain diffusions in between the rows. The trenches are formed by two masking steps, one mask having a first set of parallel strips that extend in the direction of the rows to cover the areas between trenches where the memory cells are to be formed and the other mask having a second set of parallel strips that cover the regions where source and drain diffusions will be formed, the two sets of strips being oriented orthogonally to each other. The sets of strips are formed from two photoresist masks. A layer of dielectric material covering a first layer of polysilicon on the substrate is partially removed by etching in regions exposed through the first set of mask strips. These strips are then removed and the second set of mask strips is applied. A further portion of the dielectric material is then removed in regions exposed between the second set of mask strips that is sufficient to completely remove the dielectric material from regions that have been exposed to the etchant in both steps. The dielectric layer remains across the polysilicon surface except for rectangular openings through which through the polysilicon and the substrate are etched. This process provides well defined rectangular trenches in the substrate that avoids variations in shape which result if a single photoresist mask is used to define the substrate etch pattern. Highly uniform channel widths of the memory cells adjacent the trenches then result.

Additional objects, advantages and features of the present invention are included in the following description of its preferred embodiments, which description should be taken in conjunction with the accompany drawings. Specifically, improved techniques of forming flash EEPROM cell arrays are included as part of the present invention, not only the dual gate memory cell embodiments specifically described herein but also other dual gate cell structures and memory arrays having other than the dual gate cell configuration.

BRIEF DESCRIPTION OF THE DRAWINGS

FIG. 1 illustrates in block diagram form a flash EEPROM system utilizing an array of cells formed by the processing techniques of the present invention;

FIG. 2 is a plan view of an exemplary memory cell array formed by the processing techniques of the present invention;

FIG. 3 is an isometric view of the memory cell array of FIG. 2;

FIG. 4 is a cross-sectional view of the memory cell array of FIGS. 2 and 3, taken at section I—I thereof;

FIG. 5 is an electrical equivalent circuit of one of the memory cells of the array of FIGS. 2–4;

FIGS. 6–10 are cross-sectional views of intermediate structures of the cell array of FIGS. 2–4 that occur at various stages of its processing according to a first embodiment, the A part of each of FIGS. 6–10 taken at section I—I of FIGS. 2 and 3 and the B part of each of FIGS. 6–10 taken at section III—III of FIGS. 2 and 3;

FIGS. 11–16 are cross-sectional views of intermediate structures of the cell array of FIGS. 2–4 that occur at various stages of its processing according to a second embodiment; and FIGS. 17–22 show a modified EEPROM cell array and several of the process steps to make the array according to a third embodiment, where FIGS. 18–20 are sectional views of FIG. 17 taken at respective sections IV, V and VI thereof, and FIG. 22 is a sectional view of FIG. 21 taken at section VII—VII thereof

DESCRIPTION OF THE PREFERRED EMBODIMENTS

An example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash™ Association, the MMC™ Association, and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

A specific embodiment of the memory cell array 11 is shown in FIGS. 2–4, where a small part of its repetitive structure of conductive elements are illustrated with little detail of dielectric layers that exist therebetween. A usual silicon substrate 45 includes a planar top surface 47. Elongated diffusions 49, 51 and 53 are formed into the substrate 45 through the surface 47 by an initial ion implantation and subsequent diffusion, and serve as sources and drains of the memory cells formed between them. In order to provide a convention for this description, the diffusions are shown to be spaced apart in a first x-direction, with lengths extending in a second y-direction, these first and second directions being essentially orthogonal with each other. A large number of floating gates are included across the substrate surface 47 with suitable gate dielectric therebetween, in an array of rows and columns. One row of floating gates 55–60 is adjacent to and parallel with another row of floating gates 62–67, for example, and a column of floating gates 69, 55, 62, 71 and 73 is adjacent to and parallel with a column of floating gates 75, 56, 63, 77 and 79. The floating gates are formed from a first layer of conductively doped polycrystalline silicon ("polysilicon") that is deposited over the entire surface and then separated, by etching through a mask, into the individual floating gates.

The bit line decoder and driver circuit 13 (FIG. 1) is connected through lines 15 with all of the bit line source/drain diffusions of the array, including the diffusions 49, 51 and 53 of FIGS. 2–4. The sources and drains of columns of individual memory cells are connected to proper programming voltages for either reading or programming in response to addresses supplied over the bus 25 and control signals over the lines 19.

Rather than employing a separate steering gate for each column of floating gates, the structure of FIGS. 2–4 uses one wider steering gate for every two columns of floating gates. Steering gates 81, 83 and 85 are elongated in the y-direction and have a width in the x-direction that extends across two adjacent columns of floating gates and a source/drain diffusion that is positioned in between them. The space between any two of the steering gates is at least as great as the space in the x-direction between adjacent columns of floating gates that are overlaid by the two steering gates, in order to allow a gate to be later formed at the substrate in this space. The steering gates are formed by etching a second layer of conductively doped polysilicon that is deposited over the entire surface over the first polysilicon layer and an appropriate inter-polysilicon layer dielectric. The steering gate decoder and driver circuit 21 (FIG. 1) connects though lines 23 to all the steering gates and is able to individually control their voltages in response to addresses provided on the bus 25, control signals in the lines 33, and data from the drivers and sense amplifiers 13.

Word lines 91–95 of FIGS. 2–4 are elongated in the x-direction and extend over the steering gates with spaces between them in the y-direction that places each word line in alignment with a row of floating gates. The word lines are formed by etching a third layer of conductively doped polysilicon that is deposited over the entire surface on top of a dielectric that is first formed over the second polysilicon layer and regions exposed between the steering gates. The word lines allow selection of all the memory cells in its row for reading or writing. The select gate decoder and driver circuit 19 (FIG. 1) is connected with each word line in order to individually select one row of the cell array. Individual cells within a selected row are then enabled for reading or writing by the bit line and steering gate decoder and driver circuits 13 and 21.

Although the gates in the foregoing structure are preferably made of doped polysilicon material, other suitable electrically conductive materials may be used in place of one or more of the three polysilicon layers described. The third layer, for example, from which the word lines and select gates are formed, may be a polycide material, which is polysilicon with a conductive refractive metal silicide on its top, such as tungsten, in order to increase its conductivity. Polycides are generally not used in place of either the first or second polysilicon layers because the quality of oxide grown from a polycide is usually not satisfactory.

Not shown in FIGS. 2–4 are the metal conductor layers. Since the diffusions and polysilicon elements usually have a conductivity that is significantly less than that of metal, metal conductors are included in separate layers, with connections made to respective metal lines through any intermediate layers at periodical intervals along the lengths of the polysilicon elements and diffusions. Since all of the diffusions and polysilicon elements of the embodiment of FIGS. 2–4 need to be separately driven, there is a one-to-one correspondence between the number of these metal lines and the number of diffusions and polysilicon elements. One advantage of reducing the number of steering gates by one-half, a result of the present invention, is that the number of corresponding metal lines necessary to be connected to the steering gates is also reduced by one-half. This is significant because present processing techniques are generally not able to form the metal lines with the same small pitch as diffusions and polysilicon elements. The reduction in number of metal conductors in any integrated circuit has the potential of reducing its size and complexity, to improve its operation, and increase the manufacturing yield.

There are also other advantages to extending the widths of the steering gates across two adjacent columns of floating gates, rather than providing a separate steering gate along each column of floating gates. One such advantage is that the conductivity of each steering gate is increased by more than two times, with all other parameters remaining unchanged, so that the number of contacts that must be provided along its length to a metal layer conductor is significantly reduced. Further, the additional steering gate width makes it easier to make such contacts. Another important advantage is that the steering gate width is no longer a minimum feature size of the structure, thus eliminating that constraint on the processing and making it easier to scale the size of the structure as future developments in processing allow.

With reference to the enlarged cross-sectional view of FIG. 4, other details of an exemplary dual floating gate memory cell structure are described. An electrical equivalent circuit is given in FIG. 5, where equivalent elements are identified by the same reference numbers as in FIGS. 2–4 but with a prime (') added. The illustrated cell shares the source and drain diffusions with its neighboring cells. Conduction through the cell's channel in the substrate between the adjacent diffusions 49 and 51 is controlled by different gate elements in three different regions. A first region to the left (L1-left) has the floating gate 56 immediately above it and the steering gate 81 capacitively coupled with it. A second region to the right (L1-right) is controlled in a similar manner by the floating gate 57 and the steering gate 83. A third region L2, in between the first two, is controlled by a select gate 99 that is part of the word line 92 formed from the third polysilicon layer with a gate dielectric layer between it and the substrate surface 47. Although use of n-channel semiconductor transistors is preferred, implementation of the present invention is not limited to use of such devices.

The level of conduction of electrons through the cell's channel between the diffusions 49 and 51 is thus affected by the electric fields imparted by these different gate elements to their respective channel regions by the voltages placed on the gates. The voltage on a floating gate is dependent upon the level of net electrical charge it carries plus all displacement charge that is capacitively coupled from other gates and nodes. The level of conduction that is permitted through the channel portion under a floating gate is controlled by the voltage on that floating gate. The voltage on the select gate 99 simply turns the channel on and off to any conduction in order to select individual cells for connection with their source/drain regions. An individual cell can be considered as a series connection of three transistors, one for each of the three different regions of the channel, as illustrated in the equivalent circuit of FIG. 5. The gate elements 56, 57 and 99 are the only gates that control conduction through the memory cell shown in FIG. 4, but the voltages on gates 56 and 57 are affected by the voltages on other gate, source and drain elements through capacitive coupling with them.

Another advantage of spanning two floating gate columns with a single steering gate is that the level of capacitive coupling between the floating and steering gates is increased while the coupling between the floating gate and the word line is decreased. Since the steering gate 81, for example, extends across an edge 101 of the floating gate 56 in the x-direction, that edge is shielded from coupling with the word line 92. Instead of the word line 92 extending downward between adjacent floating gates 55 and 56, as is most likely the case when the steering gate is no wider in the x-direction than the floating gate which it overlies, coupling of the word line with the floating gate edge 101 is eliminated by the steering gate extending across to the adjacent floating gate 55 and thereby providing a shield between the word line 92 and the edge 101 of the floating gate. Coupling between the floating gate 56 and the steering gate 81 is then optionally but desirably further increased by extending a portion 109 the steering gate 81 downward adjacent the floating gate edge 101. Coupling between the floating gate 56 and the word line 92 is then effectively reduced to the small area along an opposite floating gate edge 103. This significant reduction of the capacitive coupling between the floating gate and word line is very beneficial. By increasing the amount of coupling between steering and floating gates relative to the coupling of the floating gate with the substrate and the word line, less voltage need be applied to the steering gate to bring about a desired result in the memory cell's channel portion under that floating gate. A benefit that results from a reduced steering gate voltage is a reduced stress on the dielectric layer between the steering gate and the substrate, and on the dielectric layer between the steering gate and the word line, since the substrate and word line are typically operated at lower voltages than the steering gate during reading and programming operations.

One of the two floating gates of a single memory cell is selected for programming or reading by placing a voltage on the steering gate above the other floating gate of the cell that is sufficient to cause the channel region under the other floating gate become adequately conductive no matter what charge (which is related to its state) is carried by that other (non-selected) floating gate. When that cell's select transistor is turned on by a sufficient voltage applied to its word line, it is only the selected floating gate that responds to reading or programming operations directed to the cell. During reading the state of the one floating gate, current through the cell between its source and drain is then dependent upon the charge carried by the selected floating gate without regard to the charge on the other floating gate. Although the voltage placed on the steering gate over the non-selected floating gate to render the channel portion under the non-selected floating gate conductive is also coupled to an adjacent floating gate of an adjacent cell through the same steering gate, impact on the adjacent cell is avoided by placing proper voltage conditions on the other elements of the adjacent cell.

The memory cell floating gates of the embodiment of FIGS. 2–4 are preferably programmed by placing voltages on its bit lines (source and drain diffusions) and its two steering gates that cause electrons to obtain enough energy in the substrate channel region to be injected across the gate dielectric onto the selected floating gate. A preferred technique for this is "source side injection," described in the afore referenced U.S. Pat. Nos. 5,313,421 and 5,712,180.

In order to erase the memory cells of the embodiment of FIGS. 2–4, they may be designed and operated so that electrons are removed from the selected floating gates to either the channel or the select gate of the word line. If erased to the select gate, as best seen in the cell of FIG. 4, the dielectric between the floating gate edge 103 and the select gate 99 is preferably a thin layer of oxide that has been grown on the floating gate edge and through which electrons tunnel when appropriate voltages are placed on the various elements of the cell. The same is provided between the floating gate edge 105 and the select gate 99. If the cell is designed to be erased to the channel, the dielectric between the edges of the floating gates and the select gate may be made thicker and of a type that reduces the coupling between them. The dashed lines of FIG. 5 illustrate the coupling that exists when erasing to the select gate.

If the cells are to be erased to the channel, the embodiment of FIGS. 2–4 is modified somewhat. First, the dielectric between the select gate 99 and the adjacent floating gate edges 103 and 105 is made to be thicker to prevent erasing of the floating gates to the select gate. Second, the thickness of the gate dielectric between an underside of the floating gates and the substrate surface 47 is made thinner, such as about 100 Angstroms, to facilitate electrons tunneling through it. Third, the cells to be simultaneously erased as a block are grouped together and isolated on the substrate from other blocks. This is typically done by a triple well process, where an n-well is formed in a p-substrate, and a p-well carrying the block of cells is positioned within the n-well that isolates the block from others. An appropriate erase voltage is then applied to the p-wells of the blocks to be erased, while other blocks are not affected.

Another advantage of using the wider steering gates of the present invention, particularly when the floating gates are erased to the select gates of the word lines carrying a high voltage, is that the steering gates separate the word lines from the diffusions, thereby eliminating possible breakdown of a dielectric that exists between the word line and the diffusion in prior dual gate structures.

First Processing Embodiment

The cross-sectional views of FIGS. 6A and 6B show an intermediate state of the structure during the processing of the array of FIGS. 2–4, at respective sections I—I and III—III thereof that are at right angles to each other. A thin (approximately 100 Å) layer 201 of pad oxide is first grown over the surface 47 of the substrate 45. A thick (approximately 1500 Å) layer of field oxide is then deposed over the layer 201 and separated, by standard masking and etching techniques, into parallel strips 203, 205, and 207, etc., that serve to provide isolation between rows of floating gates. The lengths of these strips extends in the x-direction across the substrate.

A first layer of polysilicon having a thickness in a range of 600 to 1300 Å is then deposited over the field oxide strips and into the spaces between them, later to be separated into parallel strips 209, 211 and 213 etc. that have lengths extending in the x-direction. This polysilicon layer of material is then doped to make it conductive. A thin (approximately 100 Å) layer of oxide is then grown on the first polysilicon layer, later to be separated into interpolysilicon insulating strips 215, 217 and 219 etc. Next, a thick (approximately 2000 Å) layer of nitride is deposited over the thin oxide layer. The nitride layer is separated into strips 221, 223 and 225 etc. having lengths extending in the x-direction and being spaced as close together as possible in the y-direction. In order to reduce this spacing to form a mask to etch the first polysilicon layer, spacers are formed along the edges, such as spacers 227 and 229, by the usual technique of depositing a layer of nitride and anisotropically etching it away to leave the spacers. As is well known, the lateral dimension of the spacers can be carefully controlled by this technique. The first polysilicon and the oxide layer grown over it are then etched together through the openings between the spacers to result in the intermediate structure of FIGS. 6A and 6B.

The resulting strips of the first polysilicon layer now need to be separated into the individual floating gates with two such floating gates per cell. This could be done with a single masking step but then the subsequently formed steering gates would not be self-aligned with the floating gates. Therefore, it is done in two steps. The first separation of the polysilicon strips is shown in FIGS. 7A and 7B, where the polysilicon strip 213 is shown separated into segments 231, 233 and 235 etc. by edging the thick nitride layer and interpoly oxide. This forms the narrowest trenches between the polysilicon oxide and nitride stack that are possible with available photoresist mask and etching techniques, which is made even narrower by the formation of spacers along their side walls. Spacers 237 and 239, and similar pairs in other trenches, define openings through which source and drain implants 241 and 243 are made in the surface 47 of the substrate 45.

Since each memory cell is to have two floating gates, the segments of the first polysilicon layer that remain between adjacent source and drain implants (segment 233 between implants 241 and 243, for example) need to be separated into them. But since it is desirable that the steering gate edges be self-aligned with the floating gates, the steering gates are formed first and then used as a mask to etch the first polysilicon strips a second time. An initial step is to remove the thick nitride and all the spacers. A thin (approximately 200 Å) layer of dielectric is formed to provide layers 245 and 247 on the substrate and sidewalls of the first polysilicon layer segments. This dielectric is preferably made from an initial layer (about 100 Å thick) of oxide that is grown, followed by the deposition of a layer (about 100 Å thick) of nitride. A second layer of polysilicon is then deposited over the entire array, is doped and an interpoly oxide is grown on its top surface. The second polysilicon layer, as illustrated in FIGS. 8A and 8B, is then separated into the steering gates 81 and 83, with their respective interpoly oxide strips 249 and 251. The second polysilicon layer also fills in the spaces between the segments of the first polysilicon layer over the implants 245 and 247, shielding the implants and polysilicon edges from the later formed word lines. Capacitive coupling between the steering and floating gates is also increased by interfacing through the dielectric layers 245 and 247 etc.

Before etching the first polysilicon layer strips again, the spaces between the steering gates are reduced by the formation of spacers, such as the spacers 253 and 255 of FIG. 9A. Etching then takes place though the openings between the spacers, resulting in the floating gates 55, 56, 57 and 58 etc. If any adjustment in the doping level of the select transistor channel portion is required, an implant 257 may be made at this stage through the resulting openings between the steering and floating gate edges.

A next set of processing steps is illustrated in FIGS. 10A and 10B. A dielectric layer 259 is formed on the substrate surface and floating gate sidewalls. The portion on the substrate surface 47 provides the select transistor gate oxide. The portion along the sidewalls 103 and 105 of the floating gates 56 and 57, in this embodiment, is made thin enough so that electrons can tunnel through it to the word line select gate 99 to erase the floating gates when the proper voltages are applied to all the elements. Growing oxide to a thickness of about 250 Å is satisfactory for the layer 259 to function as both the select transistor gate oxide and tunnel erase oxide.

If, in an alternative form of the array, the floating gates are erased to the substrate, the dielectric layer 259 need not be made any thicker but the oxide layers between the floating and steering gates, and between the floating gates and the substrate, are made thinner. Electrons are then controllably moved from the floating gates to the substrate when appropriate voltages are applied to the various elements.

After the dielectric 259 is formed, a third layer of polysilicon is deposited over the array and then separated into the word lines, such as the word line 92. This layer extends into the openings between steering gates to form the select transistor gates, such as the gate 99. Alternative to the use of polysilicon for this third layer, a polycide material may be used. A polycide material is polysilicon with conductive ions added, such as some tungsten, in order to increase its conductivity. Polycides are not used in place of either the first or second polysilicon layers because the quality of oxide grown from a polycide is usually not satisfactory.

The major components of the flash EEPROM array, according to the first embodiment, have now been formed.
Second Processing Embodiment Although the most important elements of the first processing embodiment are self-aligned with one another, the two etching steps of the first polysilicon layer strips are carried out by two separate etching masks that are not self-aligned. The mask separating the second polysilicon layer into steering gates, which are in turn used to form a mask for performing the second etch of the first polysilicon layer strips (see FIG. 9A), is separate from the mask used for the first etch (see FIG. 7A). Any misalignment causes the floating gates to have equal dimensions in the x-direction. Specifically, any misalignment of the steering gate etch mask would cause one of the floating gates 56 and 57 (FIGS. 4, 9A and 10A) to have an increased dimension and the other to be made smaller.

Accordingly, the second embodiment of the present invention, described with respect to FIGS. 11–16, includes a technique that self-aligns the two etches of the first polysilicon layer strips in the x-direction. FIG. 11 shows an early state of the processing where a layer of floating gate oxide 271 has been grown on the surface of a semiconductor substrate. A first layer 275 of polysilicon has been deposited over the gate oxide layer, doped and separated into strips that are spaced apart in the y-direction into the paper (not shown). What allows the strips of polysilicon to be etched twice in a self-aligned manner is a pattern of reference elements 277–280 etc. that are periodically spaced apart along the polysilicon strips in the x-direction. The reference elements are formed from a thick layer of dielectric such as nitride that is deposited over the array and etched. This can be done either after the first polysilicon layer is separated into strips or before such separation where the nitride layer first etched away in the pattern of the polysilicon strips and thereafter further etched to form the desired reference elements.

The reference elements 277–280 are made to have a width and positions in the x-direction to the desired width and positions of the second etch of the polysilicon layer 275, as is later discussed, that defines the select transistor gates. The reference elements are then spaced along the polysilicon with one such element for every memory cell, which is one reference element for every two floating gates that are desired to be formed. The reference elements extend in the y-direction at least completely across the individual polysilicon strips that then exist or are later formed.

In order to define the first etch, a thick layer of dielectric such as oxide is deposited over the array and anisotropically etched to form spacers 281–287 etc. on either side of the reference elements 277–280. Spacers 282 and 283 are formed on opposite sides of the reference element 279, for example, and spacers 284 and 285 formed on opposite sides of the reference element 278. As is well known, the width of the resulting spacers can be accurately controlled to a desired value by selecting the height of the reference spacers and the thickness of the dielectric layer from which the spacers are formed. These parameters are controlled in this case to form the first polysilicon etch mask having openings between adjacent spacers that define the polysilicon to be removed by the first etch.

This first etch is shown in FIG. 12 to have taken place. The polysilicon is separated in the x-direction into segments 289, 291, 293 and 295 etc. Source and drain diffusions 297, 298 and 301 are then implanted into the substrate through the same mask and openings in the polysilicon. Next, the spacers are etched away without removing the reference elements, which can be done when the reference elements and spacers are made of different materials that respond differently to normally used etchants. Once the spacers are removed, layers 303, 305 and 307 etc. of interpoly dielectric is formed, preferably by growing oxide, between the reference elements 277–280. This is shown in FIG. 13 to have been done. A second layer 309 of polysilicon is then deposited over the array in a manner to extend down into the spaces between the polysilicon segments and reference elements. A next step is to remove an excess amount of the polysilicon layer 309 by chemical-mechanical-polishing (CMP) to a level defined by the reference elements 277–280 as process stops. This effectively separates the layer 309 into steering gates 311–314 etc. with one of the reference elements 277–280 between each adjacent pair of steering gates, as can be seen by FIG. 14.

A next step is to grow respective oxide layers 315–318 etc. over the polysilicon steering gates 311–314. An oxide growth step does not result in oxide being formed on the nitride reference elements 277–280. This then allows the nitride reference elements to be etched away while the oxide layers 315–318 protect their respective steering gates 311–314. As can be seen from FIG. 15, the protected steering gates then form a mask that allows the first polysilicon layer segments 289, 291, 293 and 295 to be separated into two portions having equal dimensions in the x-direction, thus forming individual floating gates 319–325 etc.

At this stage of the processing, the floating and steering gates have been fully formed. Further processing then proceeds as described above with respect to the first embodiment. Dielectric layers 327–329 etc. are formed over the substrate and along the sidewalls of exposed floating and steering gates in an appropriate manner. A third layer 331 of polysilicon (or polycide) is then deposited and separated into the word lines that are spaced apart in the y-direction. The major elements of a complete flash EEPROM cell array are thus formed.

Although this two aligned etch step technique has been described in its preferred embodiment of processing a dual gate flash EEPROM cell array, it has other applications where it is desired to align the masks for two etching steps that are performed at different times.

Alternate Structure and Third Processing Embodiment

In the first embodiment, field oxide strips (elements 203, 205 and 207 etc. of FIGS. 6–10, for example) are provided on the surface of the semiconductor substrate as electrical isolation between rows of memory cells, and the same is contemplated for the second embodiment, although the views of FIGS. 11–16 do not show it. In this third embodiment, additional isolation is provided between rows by recessing the field oxide into trenches formed into the substrate between adjacent memory cells in the y-direction. This allows the memory cells to be placed closer together in the columnar direction as improvements in processing technology permit smaller feature size. Although the integrated circuit described in this third embodiment is a dual gate flash EEPROM cell array, its processing techniques also have application to isolating other types of memory cells or other types of integrated circuit elements.

Referring initially to a plan view of a portion of a memory cell array of FIG. 17, it is desired to form a mask to etch rectangles 351–359 etc. Such a mask includes a first component of parallel strips 361–364 etc. (source/drain mask) with their lengths extending in the y-direction positioned over regions where source and drain diffusions are to be formed. A second component of the mask includes parallel strips 367–370 etc. (channel mask) extending in the x-direction and positioned where rows of memory cells are to be formed. The rectangles 351–359 etc. to be etched are then exposed though the mask.

This mask could be made from a single layer of photoresist material but the experience in using photoresist to form very small rectangles is that the corners become rounded in uncontrolled ways. This can have an adverse effect upon the resulting memory cell array by changing the width of the memory cell transistor channels from that which is designed. This has some effect upon operation of the memory cells, which effect will be unacceptable in most applications. The corners cannot be eliminated by extending the trenches continuously along the rows to span multiple cells since the source and drain diffusions that cross them need to be maintained at the surface of the substrate.

In order to etch the rectangles 351–359 etc., an intermediate mask is formed from a dielectric material or materials. This intermediate dielectric mask is separately etched through the two mask components that are formed at different times from photoresist material. The dielectric mask is partially removed through one of the source/drain mask (strips 361–364) or channel mask (strips 367–370), that mask removed and then the other of these photoresist masks put in place, followed by a second etch of a portion of the thickness of the intermediate dielectric mask through the other of the two photoresist masks. The two partial etches of the intermediate dielectric material layer are made to be sufficient, when combined in the same regions, to remove the layer entirely in where neither of the mask components covers the layer, in this case providing openings in the dielectric which form the rectangles 351–359 with sharply defined corners. But since each etch removes only a portion of the dielectric layer, the regions under either of the photoresist mask components remains part of the finished intermediate mask, although reduced in thickness. The material under the intermediate mask is then etched through that mask to remove material in the shape of the rectangles 351–359 with sharp corners, while not removing material from other regions of the underlying surface.

A specific application of this technique can be explained with respect to the cross-sectional views of FIGS. 18–20 of the structure shown in plan view in FIG. 17. Rather than forming the intermediate dielectric mask directly on a surface 371 of the substrate 373, a layer of floating gate oxide is first grown on the substrate and the first layer of polysilicon is deposited. The intermediate mask is then formed on top of the first polysilicon layer. The polysilicon layer, gate oxide layer and substrate are then etched through the rectangles defined by the intermediate dielectric mask, so that the remaining polysilicon is self aligned with the substrate trenches. Regions 375 of gate oxide and regions 377 of the first polysilicon layer remain.

The dielectric for the intermediate mask 379 is most conveniently a single layer of oxide that is deposited over the first polysilicon layer. The photoresist strips 367–370 of the channel mask are then formed over the oxide, and a majority of the thickness of the oxide is removed in regions not under the photoresist mask. The photoresist strips 367–370 are then removed and the photoresist strips 361–364 are formed over the partially etched dielectric mask layer. A majority of the dielectric layer is again removed by etching regions not covered by the photoresist strips 367–370. Since areas of the dielectric corresponding to the rectangles 351–359 were exposed and etched both times, all the intermediate mask material has been removed from the rectangles. In other regions of the mask 379, either the fill thickness remains (in areas covered by both photoresist masks), such as in region 381 of FIG. 20, or less than half of its thickness remains (in areas that were covered by only one of the photoresist masks), such as region 383. The individual dielectric mask etching steps, although removing a majority of the thickness of the layer, is controlled to maintain enough thickness in the regions that are etched only once, such as the region 383, to mask the material thereunder from being attacked by the etchant.

As an alternative to using a single layer for the intermediate mask, it can be made of two different dielectric materials, such as a bottom layer of a nitride with a layer of an oxide deposited on top of it. The first etch through the channel photoresist mask then uses an etchant that removes the oxide but not the nitride, and the second etch through the source/drain photoresist mask uses an etchant that removes nitride but not the oxide. This differential etch technique makes each of the etches somewhat self-limiting.

After the trenches 351–359 are etched through the polysilicon, gate oxide and into the substrate, as illustrated in FIGS. 17–20, the trenches are filled with field oxide by depositing a thick layer of oxide over the array, thus filling in the trenches, and then removing by CMP all of this field oxide down to the top of the surrounding polysilicon. A next step is to remove remaining polysilicon from the regions of the substrate in which the source and drain diffusions are to be formed. This is done by forming another mask 385 over the structure, as shown in FIG. 21, that provides elongated mask openings 387 and 389 etc. having their lengths oriented in the y-direction. The polysilicon of the layer 377 under the openings 387 and 389 is removed without etching into the substrate. Since the mask 385 is not self-aligned with the source/drain mask 361–364 used to form the rectangular trenches in the polysilicon, the etched rectangles are made to be slightly longer in the x-direction than necessary in order to allow some misalignment of the masks in the x-direction and still make sure that all the polysilicon material is removed from between the trenches. The result is the removal of polysilicon to form spaces 391 and 393 etc. through which source and drain implants 395 and 397, elongated in the y-direction, are made.

The mask 385 is also shown in FIG. 21 to have elongated openings 399, 401 and 403 that simultaneously separate the blocks of polysilicon remaining between source and drain diffusions into individual floating gates. When this is done, the openings 399, 401 and 403 are covered by photoresist or some other appropriate material during the source and drain implant step. By using a single mask for both steps, the floating gates will all have the same dimension in the x-direction along the memory cell channels. The steering gates are then formed from a second layer of polysilicon by a separate mask.

Alternatively, the mask 385 omits the openings 399, 401 and 403. The steering gates are first formed from a second layer of polysilicon and their edges used to define where the first polysilicon layer is etched to divide each cell's single piece of polysilicon into its separate floating gates. This technique has already been described as part of the first embodiment, with reference to FIGS. 6–10. If this alternative is used, the array is completed in accordance with most of the same steps as described for the first embodiment.

Although the various aspects of the present invention have been described with respect to certain preferred embodiments, it is understood that the invention is entitled to protection within the full scope of the appended claims.

It is claimed:

1. A self-aligned method of processing a first layer of material on a semiconductor substrate, comprising:
    forming reference elements on the first layer that have a uniform dimension and a uniform spacing in at least one direction across the first layer,
    thereafter forming spacers along edges of the reference elements that face said at least one direction in a manner defining spaces between them,
    thereafter performing a first processing of the first layer of material through the spaces by using the reference elements and spacers as a first mask against the first processing of portions of the first layer not exposed through the spaces,
    thereafter removing the spacers, thereby leaving open regions between the reference elements in said at least one direction,
    thereafter filling the open regions between the reference elements with a second layer of material in a manner that leaves top surfaces of the reference elements exposed,
    thereafter removing the reference elements, thereby leaving openings between areas of the second layer of material in said at least one direction where the reference elements had been positioned, and
    thereafter performing a second processing of the first layer of material through the openings by using the second layer of material as a mask against the second processing of portions of the first layer not exposed through the openings,
    whereby the first and second processing is performed at self-aligned positions across the first layer in at least said one direction.

2. The method of claim 1, wherein each of the first and second processing includes etching away a volume of the first layer.

3. The method of claim 2, wherein the first processing additionally includes, after etching away the first layer, of implanting ions into the substrate to form source and drain regions therein.

4. The method of claim 3, wherein filling the open regions between the reference elements includes filling a volume of the first layer that has been etched away during the first processing.

5. The method of claim 4, additionally comprising after etching the first layer during the second processing, of forming a third layer of material over the second layer of material in a manner to fill a volume of the first layer that has been etched away during the second processing.

6. The method of claim 5, wherein the first, second and third layers of material include polysilicon.

7. The method of claim 1, wherein the first and second layers of material include polysilicon.

8. The method of claim 1, wherein forming the reference elements and forming the spacers includes forming each from different dielectric materials.

9. The method of claim 8, wherein the reference elements are formed from silicon nitride and the spacers are formed from silicon dioxide.

10. The method of claim 9, wherein at least the second layer of material includes polysilicon, and which additionally comprises, after filling the open regions between the reference elements with the second layer of material but before removing the reference elements, of growing oxide on a top surface of the second layer of material between the reference elements, thereby to protect the second layer of material during the removing the reference elements.

11. The method of claim 1, wherein filling the open regions between the reference elements with the second layer of material includes depositing the material of the second layer over the reference elements and into the open regions therebetween, and thereafter removing material of the second layer that lies above the top surfaces of the reference elements.

12. The method of claim 1, wherein forming spacers along edges of the reference elements includes depositing a layer of dielectric material over and in between the reference elements, and thereafter anisotropically etching the dielectric material until the dielectric material is removed except for the spacers.

13. The method of claim 1, wherein an array of non-volatile flash EEPROM memory cells is being at least partially formed.

14. A method of forming a non-volatile memory on a semiconductor substrate, comprising:

growing a layer of gate dielectric on a surface of the substrate, depositing a first layer of conductive gate material over the gate dielectric layer, separating the first layer into strips having lengths extending in a first direction and being spaced apart in a second direction, the first and second directions being orthogonal to each other, separating the first layer strips into segments extending in the first direction, implanting ions into the substrate through spaces between said first layer segments, depositing a second layer of conductive gate material over the first layer strips, separating the second layer into strips having lengths extending in the second direction and being spaced apart in the first direction, widths of the second layer strips extending in the first direction over the substrate ion implants and portions of the second layer strips on both sides thereof, separating the first layer strip segments along the first direction into elements by using edges of the second layer strips as references, depositing a third layer of conductive gate material over the second layer strips, and separating the third layer into strips having lengths extending in the first direction and being spaced apart in the second direction, said third layer strips extending in between the second layer strips and spaces between the first layer elements.

* * * * *